United States Patent
Lee et al.

(10) Patent No.: US 10,743,439 B1
(45) Date of Patent: Aug. 11, 2020

(54) THIN FILM CHAMBER FOR PORTABLE ELECTRONIC DEVICE WITHOUT INJECTION TUBE AND METHOD OF MANUFACTURING THE SAME

(71) Applicant: POLAR & Co., INC., Gunpo-si (KR)

(72) Inventors: Kiwoo Lee, Daejeon (KR); Jongsun Kim, Hwaseong-si (KR); Sanggyung Kim, Suwon-si (KR); Jinglong Cui, Shenzhen (CN)

(73) Assignee: POLAR & CO., INC., Gunpo-si (KR)

( * ) Notice: Subject to any disclaimer, the term of this patent is extended or adjusted under 35 U.S.C. 154(b) by 0 days.

(21) Appl. No.: 16/578,904

(22) Filed: Sep. 23, 2019

(30) Foreign Application Priority Data

Apr. 16, 2019 (KR) .......................... 10-2019-0044020

(51) Int. Cl.
*H05K 7/20* (2006.01)
*H05K 5/00* (2006.01)

(52) U.S. Cl.
CPC .......... *H05K 7/2039* (2013.01); *H05K 5/0086* (2013.01)

(58) Field of Classification Search
CPC ............. F28D 15/0233; F28D 15/0275; F28D 15/046; F28D 15/04; F28D 15/0283; F28D 2021/0028; F28D 1/0308; F28D 9/0006; Y10T 29/49353; G06F 1/20; G06F 2200/201; H05K 7/20336; H05K 1/0203;
(Continued)

(56) References Cited

U.S. PATENT DOCUMENTS 5,186,250 A * 2/1993 Ouchi ................... F28D 1/0316
165/152
5,996,633 A * 12/1999 Kato ..................... F28D 1/0316
138/38
(Continued)

FOREIGN PATENT DOCUMENTS

JP 2005326133 11/2005
JP 2010243035 10/2010
(Continued)

OTHER PUBLICATIONS

Korean Office Action—Korean Application No. 10-2019-0044020 dated Jul. 8, 2019, citing KR 10-0451916, KR 10-2009-0045146, JP 2005-326133 and JP 2010-243035.

*Primary Examiner* — Adam B Dravininkas
(74) *Attorney, Agent, or Firm* — Cantor Colburn LLP (57) ABSTRACT

Provided is a thin film vapor chamber for portable electronic devices. The vapor chamber includes: a lower plate formed in a plate shape and having protrusions formed on an upper surface thereof, first protrusions formed to protrude and formed on one side of the upper surface thereof to be spaced apart from each other, and a first joint body formed to protrude upward and formed inward from an outer edge thereof; and an upper plate formed in a shape corresponding to the lower plate and including a second joint body formed to protrude and joined to an upper side of the lower plate, second protrusions formed to correspond to the first protrusions, an inlet formed on an inner side of each of the second protrusions and into which a working fluid is injected, and a step formed to protrude downward to close the inlet by contact with the lower plate.

6 Claims, 5 Drawing Sheets

(58) Field of Classification Search
CPC ............ H05K 7/2039; H05K 7/20327; H05K 5/0086; F28F 3/12
See application file for complete search history.

(56) References Cited

U.S. PATENT DOCUMENTS

| | | | | |
|---|---|---|---|---|
| 6,082,443 | A * | 7/2000 | Yamamoto | F28D 15/0233 165/104.21 |
| 6,269,866 | B1 * | 8/2001 | Yamamoto | F28D 15/0233 165/104.26 |
| 6,863,118 | B1 * | 3/2005 | Wang | F28D 15/0233 165/104.21 |
| 2002/0056542 | A1 * | 5/2002 | Yamamoto | F28D 15/0233 165/80.3 |
| 2009/0260785 | A1 * | 10/2009 | Wang | B23P 15/26 165/170 |
| 2012/0080170 | A1 * | 4/2012 | Yang | F28D 15/0283 165/104.26 |
| 2013/0092353 | A1 * | 4/2013 | Yang | F28D 15/0233 165/104.26 |
| 2015/0026981 | A1 * | 1/2015 | Yang | F28F 3/044 29/890.039 |
| 2015/0060022 | A1 * | 3/2015 | Sun | F28D 15/04 165/104.26 |
| 2019/0226770 | A1 * | 7/2019 | Cheng | F28D 15/0233 |
| 2019/0247964 | A1 * | 8/2019 | Zhou | F28D 15/0283 |
| 2019/0271510 | A1 * | 9/2019 | Yang | F28D 15/0233 |
| 2019/0360762 | A1 * | 11/2019 | Aoki | H01L 23/427 |
| 2020/0023422 | A1 * | 1/2020 | Lin | B23P 15/26 |

FOREIGN PATENT DOCUMENTS

| | | |
|---|---|---|
| KR | 100451916 | 10/2004 |
| KR | 20090045146 | 5/2009 |
| KR | 101998343 | 7/2019 |

* cited by examiner

THIN FILM CHAMBER FOR PORTABLE ELECTRONIC DEVICE WITHOUT INJECTION TUBE AND METHOD OF MANUFACTURING THE SAME

BACKGROUND

1. Field of the Invention

The present disclosure relates to a thin film vapor chamber for portable electronic devices without an injection tube and a method of manufacturing the same, and more particularly, to a thin film vapor chamber for portable electronic devices without an injection tube capable of eliminating the inconvenience of installing a cooling device inside the portable electronic devices, forming an inner space of the vapor chamber for portable electronic devices in a vacuum state at a high speed, and injecting a large amount of working fluid in a short time by forming a vacuum state in the inner space and forming an inlet configured to inject the working fluid on a flat surface, and capable of preventing damages and manufacturing defects of the vapor chamber while forming the vacuum state or injecting the working fluid and sealing the inlet by forming the inlet on a plane, and a method of manufacturing the same.

2. Description of Related Art

Generally, portable electronic devices include at least one of a central processing unit (CPU), a random access memory (RAM), a circuit board, and a battery to display images on a screen, display sounds, and maintain a set operation, thereby providing convenience and aiding in the everyday life of a user.

Since these portable electronic devices have a high CPU processing speed and execute various tasks, the amount of CPU workload is high, and thus the CPU generates a large amount of heat. Furthermore, it is not easy to install an effective cooling means in the portable electronic devices due to the slim structure of the portable electronic devices.

Thus, a large amount of heat is generated in the portable electronic devices, and the excessive heat generated in the portable electronic devices causes a user to feel uncomfortable and anxious. That is, since an accident in which a portable electronic devices exploded due to a defective battery or the like has been reported, the user may be in great anxiety when the portable electronic devices becomes too hot.

Even without this problem, the heat generated in the portable electronic devices may damage semiconductors in the portable electronic devices or cause an operation error, and thus, it is desirable that heat is radiated and the device is cooled as quickly as possible.

Thus, in conventional portable electronic devices, heat generated from an internal CPU and a battery is cooled by a heat radiation device of a heat pipe structure, but such a conventional vapor chamber has a drawback in that the thickness thereof becomes thicker and the cooling efficiency is poor.

Further, an internal thickness of the vapor chamber may be increased to 0.4 to 0.5 mm by employing the vapor chamber made of copper, an injection tube may be broken while injecting a working fluid into an inside of the vapor chamber and sealing inlet because the copper material is too soft, and it may be difficult to manufacture the vapor chamber due to the injection tube formed in a thin-film having a thickness of 0.4 mm.

The related patent discloses an electronic device including a housing, a printed circuit board located inside the housing, electrical components mounted on the printed circuit board, and a shield can covering the electrical components, wherein the shield can has a recessed region formed at least in a part thereof, and a metal structure for cooling heat generated in the electrical components is mounted in the recessed region.

However, in the related patent, the problems of the conventional vapor chamber still exist, in which an injection tube may be broken, and thus the defect rate of a product may be increased while injecting a working fluid into an inside of the vapor chamber through the injection tube and sealing, and the injection tube may be broken while coupling to an electronic product or the coupling may be difficult due to the shape of the injection tube.

SUMMARY OF THE INVENTION

The present disclosure is directed to providing a thin film vapor chamber for portable electronic devices without an injection tube capable of eliminating the inconvenience of installing a cooling device inside the portable electronic device, forming an inner space of the vapor chamber for portable electronic devices in a vacuum state at a high speed, and injecting a large amount of working fluid in a short time by forming a vacuum state in the inner space and forming an inlet configured to inject the working fluid on a plane, and capable of preventing damages and manufacturing defects of the vapor chamber while forming the vacuum state or injecting the working fluid and sealing the inlet by forming the inlet on a plane, and a method of manufacturing the same.

According to an aspect of the present disclosure, there is provided a thin film vapor chamber, which is provided inside a portable electronic device and configured to radiate heat, including:

a lower plate formed in a metal plate shape and having a plurality of protrusions formed on an upper surface thereof, a plurality of first protrusions formed to protrude and formed on one side of the upper surface thereof to be spaced apart from each other by a predetermined distance, and a first joint body formed to protrude upward and formed at a predetermined distance inward from an outer edge thereof along an edge shape;

and an upper plate formed in a shape corresponding to the lower plate and including a second joint body formed to protrude and joined to an upper side of the lower plate, a plurality of second protrusions formed to protrude so as to correspond to the first protrusions, an inlet formed on an inner side of each of the second protrusions and into which a working fluid is injected, and a step formed to protrude downward so as to close the inlet by being brought into contact with the lower plate when the lower plate is bent to the inlet, wherein an inner space formed between the upper plate and the lower plate, in a state in which the lower plate is tightly coupled to the inlet of the upper plate and joined thereto, is made to be in a vacuum state through a vacuum injection body, and the working fluid is injected into the inner space.

The portable electronic device may include a smartphone, a wireless charger, a laptop computer, a portable device for games, or a tablet personal computer (PC).

The vacuum injection body may be formed to be larger than the inlet so as to be in close contact with the inlet of the upper plate and coupled to cover the inlet of the upper plate and may include a suction port formed therein to suction air in the inner space of the vapor chamber through a vacuum pump connected to an upper side of the suction port to make a vacuum state in the inner space, and may include a supply port formed on an upper side or side surface thereof and to which a working fluid injection device is connected to inject the working fluid into the vacuumed inner space.

According to another aspect of the present disclosure, there is provided a method of manufacturing a thin film vapor chamber for a portable electronic device without an injection tube, the method including:

preparing a lower plate formed in a metal plate shape, which includes forming a plurality of protrusions on an upper surface of the lower plate, forming a plurality of first protrusions protruding at a predetermined interval on one side of the upper surface of the lower plate, and forming a first joint body protruding upward at a predetermined distance inward from an outer edge of the lower plate along an edge shape (S10);

preparing an upper plate formed in a shape corresponding to the lower plate, which includes forming a second joint body protruding and being joined to an upper side of the lower plate, forming a plurality of second protrusions protruding so as to correspond to the first protrusions, forming an inlet, into which a working fluid is injected, on an inner side of each of the second protrusions, and forming a step protruding downward so as to close the inlet by being brought into contact with the lower plate when the lower plate is bent to the inlet (S20); bonding the upper plate and the lower plate through a bonding agent (S30); coupling a vacuum injection body to the inlet of the bonded upper plate (S40); forming a vacuum state in an inner space through a vacuum pump connected to the vacuum injection body and injecting the working fluid into the inner space through a supply port formed on an upper side or side surface of the vacuum injection body (S50); when the injection of the working fluid is completed, bending the lower plate at a portion of the inlet through a pressing body such that the step of the inlet is brought into contact with the lower plate to close the inlet (S60); and manufacturing a vacuum chamber by welding the lower plate which closes the inlet to the upper plate by laser welding using a laser welding device to seal the inlet and then separating the vacuum injection body (S70).

The vacuum injection body may be formed to be larger than the inlet so as to be in close contact with the inlet of the upper plate and coupled to cover the inlet of the upper plate, and the vacuum injection body may include a suction port formed therein to suction air in the inner space of the vapor chamber through a vacuum pump connected to an upper side of the suction port to make a vacuum state in the inner space, and may include a supply port formed on an upper side or side surface thereof and to which a working fluid injection device is connected to inject the working fluid into the vacuumed inner space.

The pressing body may be formed to correspond to the step formed in the inlet of the upper plate, maintains a pressurized state to maintain the bent state continuously (when bent, the upper and lower plates need to be attached without any gap) during laser welding, and may include a through-hole formed to pass through an inside of the pressing body to perform the laser welding in the pressurized state so that the laser welding is performed in the pressurized state.

In the present disclosure, since a vacuum state is formed in an inner space of the vapor chamber for portable electronic devices and an inlet configured to inject a working fluid is formed on a plane, there are effects in which the inconvenience of installing a cooling device inside the portable electronic device can be eliminated, a vacuum state can be formed in the inner space at a high speed, and a large amount of working fluid can be injected in a short time.

Further, since an inlet is formed on a plane, there is an effect of preventing damages and manufacturing defects of a vapor chamber while forming a vacuum state or injecting a working fluid and sealing the inlet.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, specific embodiments of the present disclosure will be described with reference to the drawings. The embodiments of the present disclosure are intended to describe one disclosure, and thus the scope of the disclosure is not limited to the exemplified embodiments, and the exemplified drawings are illustrated by enlarging only important contents for clarity of the disclosure and omitting ancillary matters, and thus the present disclosure should not be construed to be limited to the drawings.

The present disclosure relates to a vapor chamber, which is provided inside a portable electronic device and configured to radiate heat, including a lower plate 20 formed in a metal plate shape and having a plurality of protrusions 22 formed on an upper surface thereof, a plurality of first protrusions 21 formed to protrude and formed on one side of the upper surface thereof to be spaced apart from each other by a predetermined distance, and a first joint body 23 formed to protrude upward and formed at a predetermined distance inward from an outer edge thereof along an edge shape and including an upper plate 10 formed in a shape corresponding to the lower plate 20 and having a second joint body 13 formed to protrude and joined to an upper side of the lower plate 20, a plurality of second protrusions 11 formed to protrude so as to correspond to the first protrusions 21, an inlet 12 formed on an inner side of each of the second protrusions 11 and into which a working fluid is injected, and a step 14 formed to protrude downward so as to close the inlet 12 by being brought into contact with the lower plate 20 when the lower plate 20 is bent to the inlet 12, wherein, an inner space formed between the upper plate 10 and the lower plate 20, in a state in which the lower plate 20 is closely coupled to the inlet 12 of the upper plate 10 and joined thereto, is made to be in a vacuum state through a vacuum injection body 30, and the working fluid is injected into the inner space.

The portable electronic device includes a smartphone, a wireless charger, a laptop computer, a portable device for games, or a tablet personal computer (PC).

The vacuum injection body 30 is formed to be larger than the inlet 12 so as to be in close contact with the inlet 12 of the upper plate 10 and coupled to cover the inlet 12 of the upper plate 10 and includes a suction port 31 formed therein to suction air in the inner space of the vapor chamber through a vacuum pump connected to an upper side of the suction port 31 to make a vacuum state in the inner space and includes a supply port 32 formed on an upper side or side surface thereof and to which a working fluid injection device is connected to inject the working fluid into the vacuumed inner space.

Figure 3:
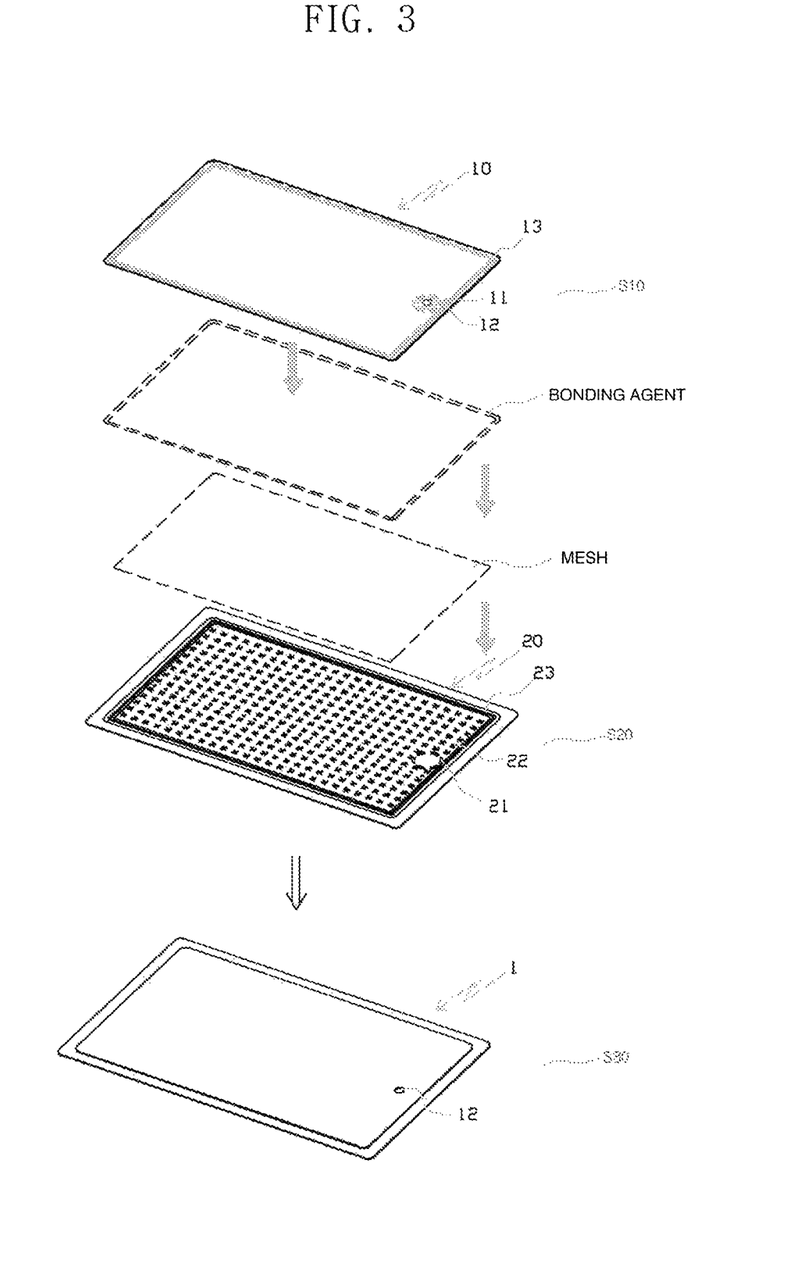
FIG. 3 is a view sequentially illustrating a method of manufacturing a thin film vapor chamber for portable electronic devices without an injection tube according to the present disclosure.
Figure 4:
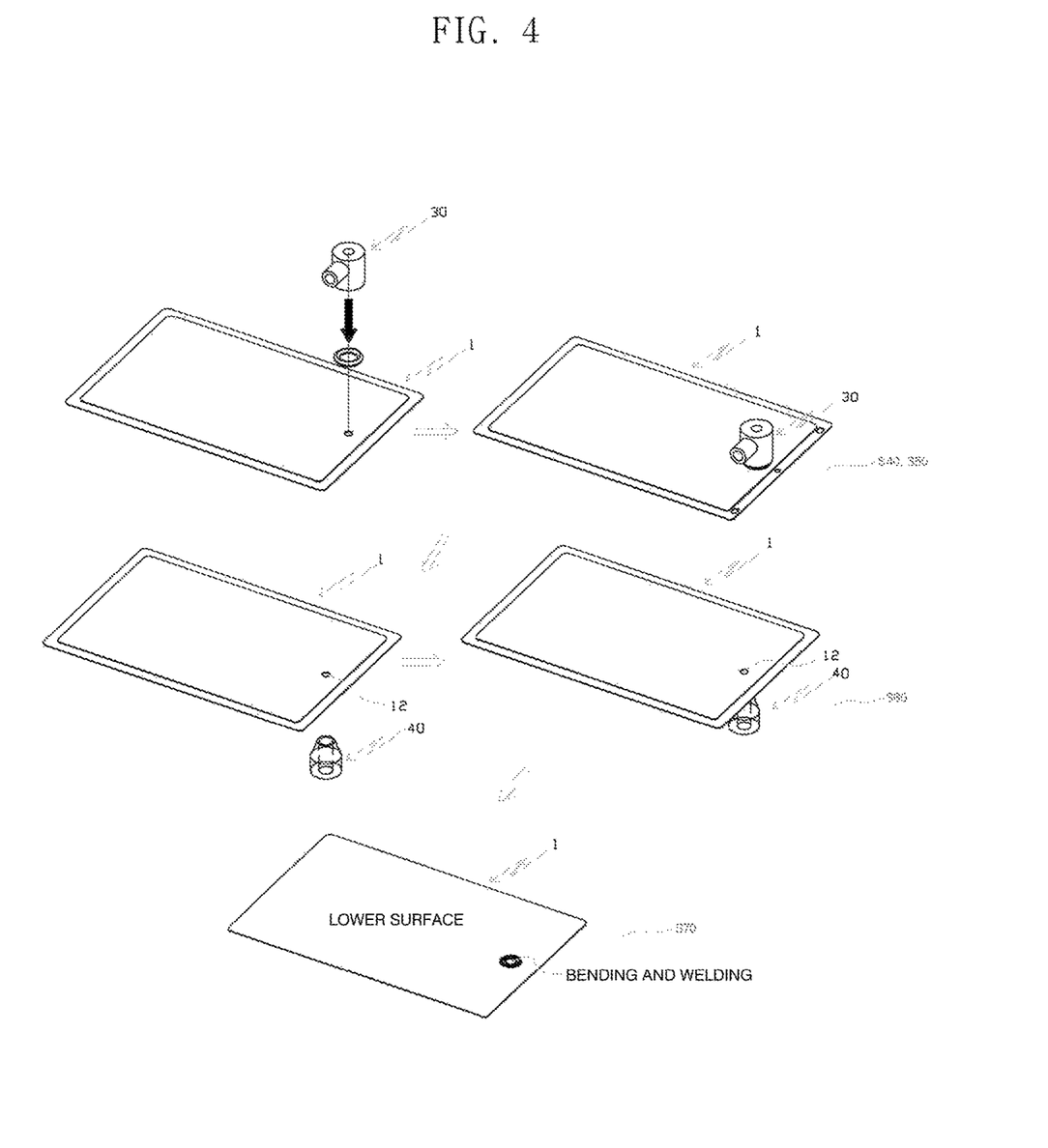
FIG. 4 is a view illustrating a process of manufacturing a vapor chamber according to the method of manufacturing the thin film vapor chamber for portable electronic devices without an injection tube according to the present disclosure, following FIG. 3.
Figure 5:
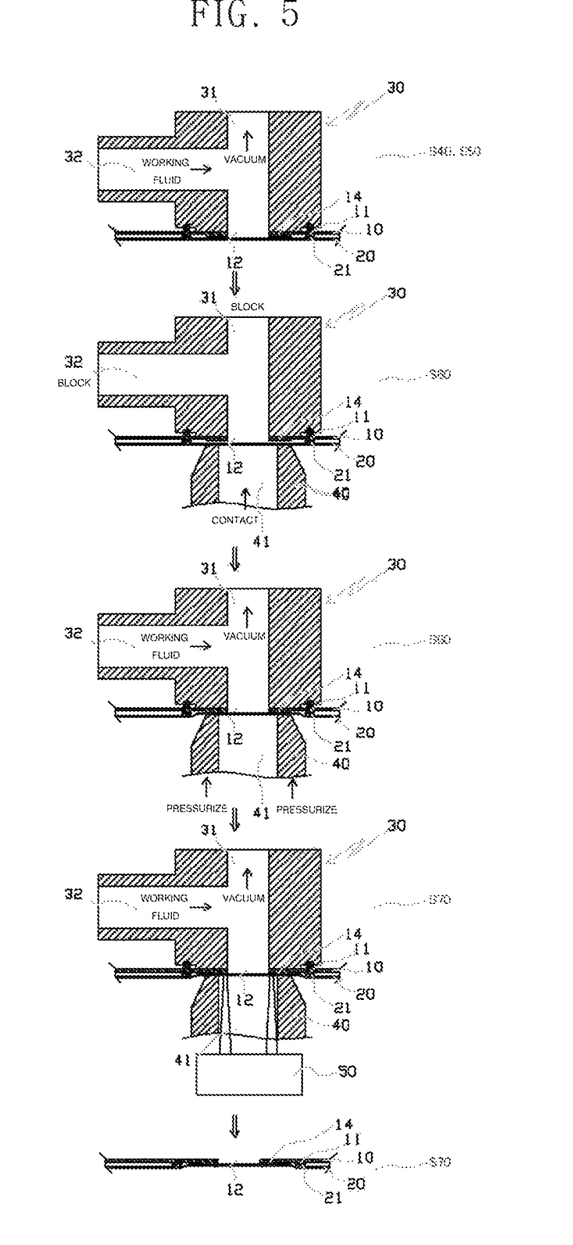
FIG. 5 is a view illustrating the process of FIG. 4 in more detail according to the method of manufacturing the thin film vapor chamber for portable electronic devices without an injection tube according to the present invention.

A method of manufacturing a thin film vapor chamber for portable electronic devices without an injection tube includes: preparing a lower plate 20 formed in a metal plate shape, which includes forming a plurality of protrusions 22 on an upper surface of the lower plate 20, forming a plurality of first protrusions 21 protruding at a predetermined interval on one side of the upper surface of the lower plate 20, and forming a first joint body 23 protruding upward at a predetermined distance inward from an outer edge of the lower plate 20 along an edge shape (S10); preparing an upper plate 10 formed in a shape corresponding to the lower plate 20, which includes forming a second joint body 13 protruding and being joined to an upper side of the lower plate 20, forming a plurality of second protrusions 11 protruding so as to correspond to the first protrusions 21, forming an inlet 12, into which a working fluid is injected, on an inner side of each of the second protrusions 11, and forming a step 14 protruding downward so as to close the inlet 12 by being brought into contact with the lower plate 20 when the lower plate 20 is bent to the inlet 12 (S20); bonding the upper plate 10 and the lower plate 20 through a bonding agent (S30); coupling a vacuum injection body 30 to the inlet 12 of the bonded upper plate 10 (S40); forming a vacuum state in an inner space through a vacuum pump connected to the vacuum injection body 30 and injecting the working fluid into the inner space through a supply port 32 formed on an upper side or side surface of the vacuum injection body 30 (S50); when the injection of the working fluid is completed, bending the lower plate 20 at a portion of the inlet 12 through a pressing body 40 such that the step 14 of the inlet 12 is brought into contact with the lower plate 20 to close the inlet 12 (S60); and manufacturing a vacuum chamber 1 by welding the lower plate 20 which closes the inlet 12 to the upper plate 10 by laser welding using a laser welding device 50 to seal the inlet 12 and then separating the vacuum injection body 30 (S70).

The vacuum injection body 30 is formed to be larger than the inlet 12 so as to be in close contact with the inlet 12 of the upper plate 10 and coupled to cover the inlet 12 of the upper plate 10 and includes a suction port 31 formed therein to suction air in the inner space of the vapor chamber through a vacuum pump connected to an upper side of the suction port 31 to make a vacuum state in the inner space and includes a supply port 32 which is formed on an upper side or side surface thereof and to which a working fluid injection device is connected to inject the working fluid into the vacuumed inner space.

The pressing body 40 is formed to correspond to the step 14 formed in the inlet 12 of the upper plate 10, maintains a pressurized state to maintain the bent state continuously (when bent, the upper and lower plates need to be attached without any gap) during laser welding, and includes a through-hole 41 formed to pass through an inside of the pressing body 40 to perform the laser welding in the pressurized state so that the laser welding may be performed in the pressurized state.

Figure 1:
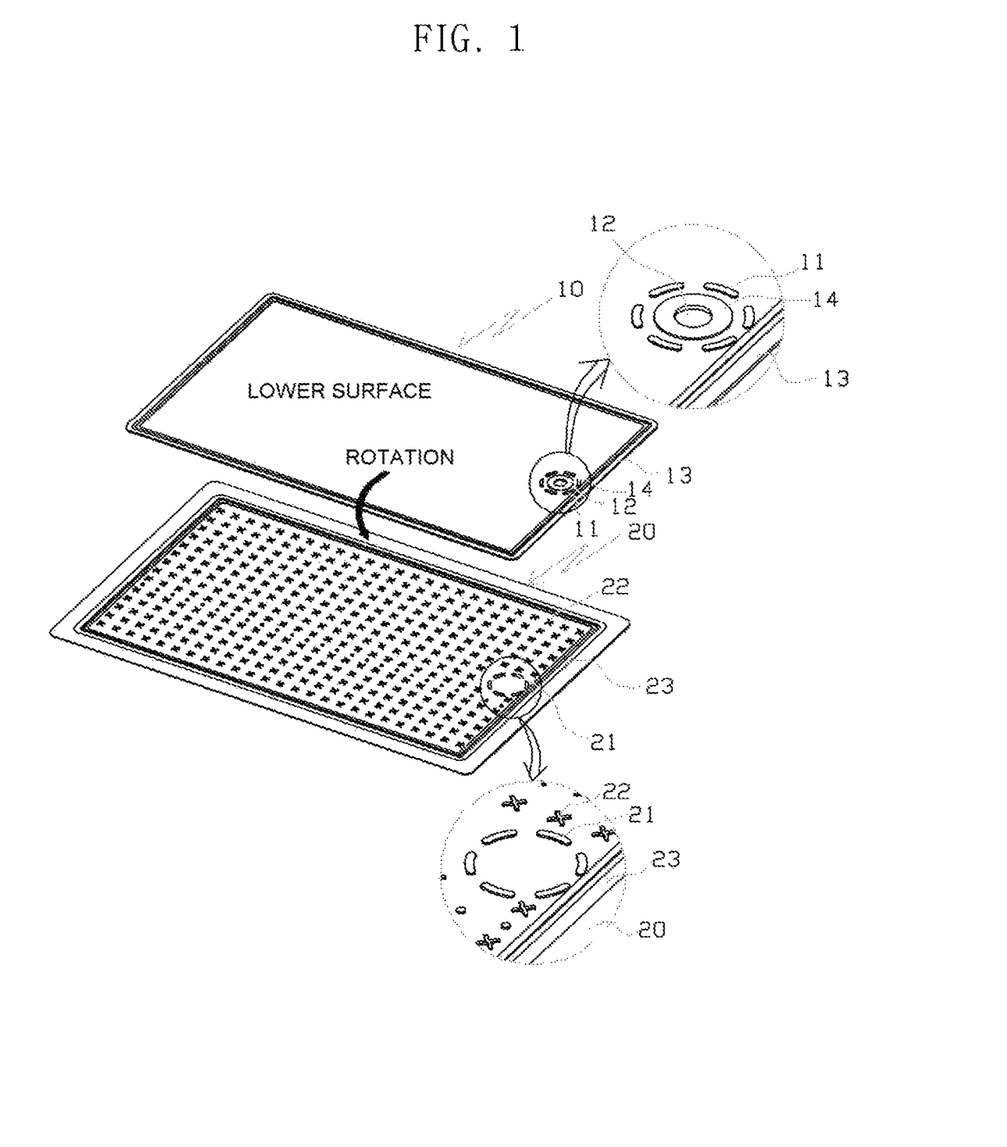
FIG. 1 is a view illustrating the overall configuration of a thin film vapor chamber for portable electronic devices without an injection tube according to an embodiment of the present disclosure.

FIG. 1 is a view illustrating the overall configuration of a thin film vapor chamber for portable electronic devices without an injection tube according to the embodiment of the present invention, and the vapor chamber is provided inside a portable electronic device and configured to radiate heat and includes a lower plate 20 formed in a metal plate shape and having a plurality of protrusions 22 formed on an upper surface thereof, a plurality of first protrusions 21 formed to protrude and formed on one side of the upper surface thereof to be spaced apart from each other by a predetermined distance, and a first joint body 23 formed to protrude upward and formed at a predetermined distance inward from an outer edge thereof along an edge shape and includes an upper plate 10 formed in a shape corresponding to the lower plate 20 and having a second joint body 13 formed to protrude and joined to an upper side of the lower plate 20, a plurality of second protrusions 11 formed to protrude so as to correspond to the first protrusions 21, an inlet 12 formed on an inner side of each of the second protrusions 11 and into which a working fluid is injected, and a step 14 formed to protrude downward so as to close the inlet 12 by being brought into contact with the lower plate 20 when the lower plate 20 is bent to the inlet 12, wherein an inner space formed between the upper plate 10 and the lower plate 20, in a state in which the lower plate 20 is closely coupled to the inlet 12 of the upper plate 10 and joined thereto, is made to be in a vacuum state through a vacuum injection body 30, and the working fluid is injected into the inner space.

The portable electronic device may include a smartphone, a wireless charger, a laptop computer, a portable device for games, or a tablet PC.

The lower plate 20 is formed in a metal plate shape and joined to the upper plate 10 to form a single vapor chamber.

The lower plate 20 is formed in a rectangular shape, and the first protrusions 21 formed to protrude at a predetermined height are formed on the upper surface of one side of the lower plate 20 to be spaced apart from each other by a predetermined distance.

The spaces are formed between the first protrusions 21 to allow the working fluid to flow between the first protrusions 21 when the working fluid is injected into the inner space of the vapor chamber.

The lower plate 20 is formed with the first joint body 23 formed to protrude upward at a predetermined distance inward from an outer edge thereof along an edge shape.

The first joint body 23 separates the space between the upper plate 10 and the lower plate 20 to form the inner space therebetween when the upper plate 10 and the lower plate 20 are joined.

Here, the second joint body 13 is formed on a lower surface of the upper plate 10 to correspond the first joint body 23 of the lower plate 20 and joined to the first joint body 23.

The plurality of protrusions 22 are formed on the upper surface of the lower plate 20 and prevent the upper plate and the lower plate from being from being closely contacted and damaged when the upper plate and the lower plate are joined to form a vacuum state.

The upper plate 10 is formed in a metal plate shape corresponding to the lower plate 20 and formed with the second joint body 13 formed to protrude downward at a predetermined distance inward from an outer edge thereof along an edge shape and with the second protrusions 11 formed to protrude downward at positions corresponding to the first protrusions 21 of the lower plate 20.

The plurality of second protrusions 11 protrude by being spaced apart from each other at a predetermined distance and are formed in a circular shape.

Figure 2:
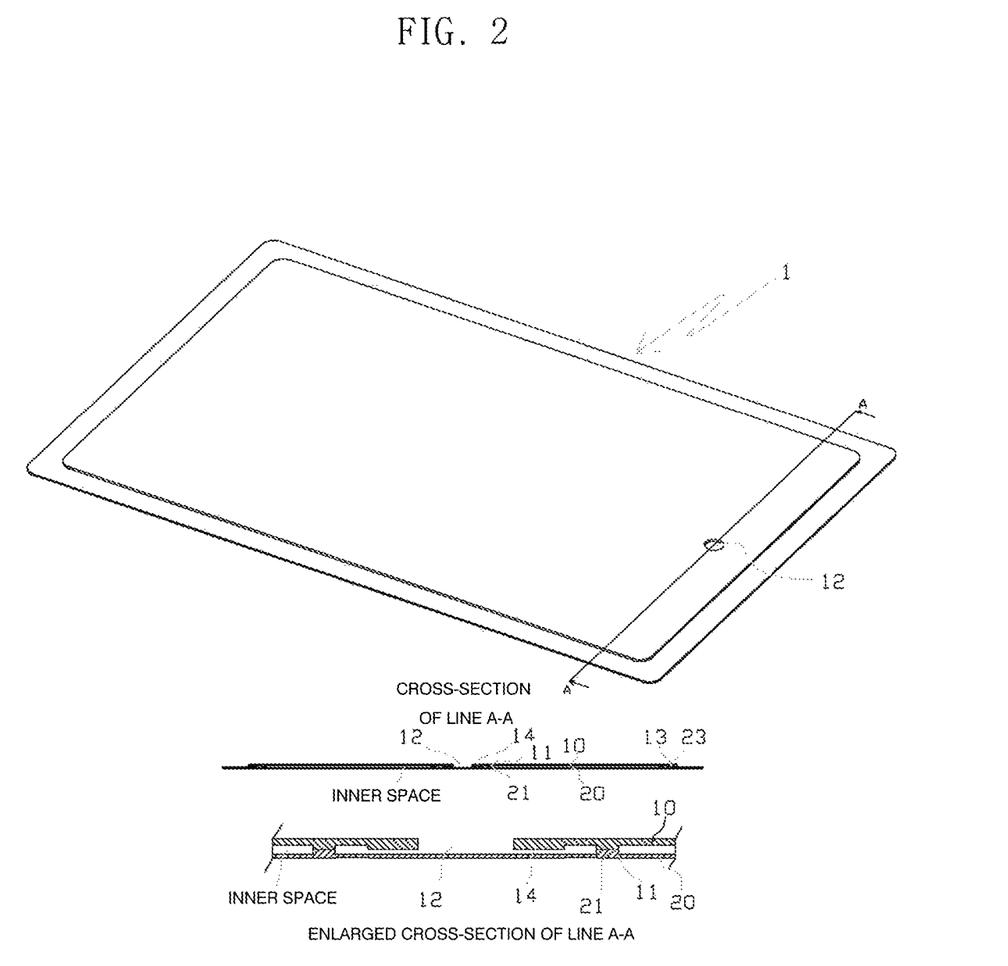
FIG. 2 is a view illustrating a coupled state of the thin film vapor chamber for portable electronic devices without an injection tube according to the present disclosure.

Accordingly, the spaces are formed between the second protrusions 11 so that the working fluid injected, which is into the spaces between the first protrusions 21 and the spaces between the second protrusions 11 in a state in which the second protrusions 11 are brought into contact with the first protrusions 21, flows into the inner space formed by joining the upper plate 10 and the lower plate 20.

The inlet 12 passing through the upper plate 10 is formed on the inner side of each of the second protrusions 11 so that the working fluid is injected therein in a state in which the upper plate 10 and the lower plate 20 are joined.

The step 14 allowing the lower plate 20 to be bent and easily come into contact therewith is formed on a lower surface of the inlet 12 in a circular shape wider than the inlet 12.

The step 14 is formed only on the upper plate 10 so that the working fluid may be easily injected without being clogged when injected.

When the upper plate 10 and the lower plate 20 are joined to form a vapor chamber, the vacuum injection body 30 is coupled to the inlet 12, and the inner space of the vapor chamber is formed into a vacuum state through a vacuum pump connected to the vacuum injection body 30, and when forming of the vacuum state of the inner space is completed, the portion of the vacuum injection body 30 to which the vacuum pump is connected is blocked, and the working fluid is injected into the inner space through a working fluid injection device connected to a supply port 32 formed on an upper side or side surface of the vacuum injection body 30.

The vacuum injection body 30 is formed to be larger than the inlet 12 to be in close contact with the inlet 12 of the upper plate 10 and formed with a suction port 31 to suction air in the inner space to form a vacuum state in the inner space and formed with the supply port 32, which is connected to the suction port 31, on the side surface to inject the working fluid into the vacuumed inner space.

A lower end of the vacuum injection body 30 is closely coupled to the inlet 12 of the upper plate 10, a seal is interposed between the inlet 12 and the vacuum injection body 30 for sealing, and the vacuum pump is connected to the upper side of the vacuum injection body 30 to suction air from the inner space of the vapor chamber through the suction port 31 formed at the center of the vacuum injection body 30 to form a vacuum state in the inner space.

When a vacuum state is formed in the inner space of the vapor chamber, the suction port 31 on the vacuum pump side is blocked, and the supply port 32 is open so that the working fluid is injected into the inner space through the working fluid injection device connected to the supply port 32.

When the injection of the working fluid into the inner space through the vacuum injection body 30 is completed, the lower plate at the portion of the inlet 12 is folded, and then the inlet 12 is sealed by laser welding using a laser welding device 50 and the vacuum injection body 30 is detached and separated, thereby manufacturing the vapor chamber.

When the lower plate 20 is bent, the lower plate 20 is bent from a lower side to an upper side through the pressing body 40 such that the lower plate 20 blocks the vicinity of the inlet 12 of the upper plate 10.

The pressing body 40 is formed to correspond to the step 14 formed in the inlet 12 of the upper plate 10, maintains a pressurized state to maintain the bent state continuously (when bent, the upper and lower plates need to be attached without any gap) during the laser welding, and includes a through-hole 41 formed to pass through an inside pressing body 40 to perform the laser welding in the pressurized state so that the laser welding may be performed in the pressurized state.

When the lower plate 20 is bent as described above, the upper plate 10 and the lower plate 20 are welded using the laser welding device 50 to prevent the working fluid from flowing out to the outside.

Here, the position in which the lower plate 20 is bent is a portion on which the inlet 12 of the upper plate 10 is formed, and the lower plate 20 covers the step 14 of the inlet 12 to close the inlet 12, thereby closing an inner side of the second protrusion 11.

A method of manufacturing the vapor chamber of the present invention having the above-described configuration is as follows.

A method of manufacturing a thin film vapor chamber for portable electronic devices without an injection tube includes: preparing a lower plate 20 formed in a metal plate shape and having a plurality of protrusions 22 formed on an upper surface thereof, a plurality of first protrusions 21 formed to protrude and formed on one side of the upper surface thereof to be spaced apart from each other by a predetermined distance, and a first joint body 23 formed to protrude upward and formed at a predetermined distance inward from an outer edge thereof along an edge shape (S10); preparing an upper plate 10 formed in a shape corresponding to the lower plate 20 and having a second joint body 13 formed to protrude and joined to an upper side of the lower plate 20, a plurality of second protrusions 11 formed to protrude so as to correspond to the first protrusions 21, an inlet 12 formed on an inner side of each of the second protrusions 11 and into which a working fluid is injected, and a step 14 formed to protrude downward so as to close the inlet 12 by being brought into contact with the lower plate 20 when the lower plate 20 is bent to the inlet 12 (S20); bonding the upper plate 10 and the lower plate 20 through a bonding agent (S30); coupling a vacuum injection body 30 to the inlet 12 of the bonded upper plate 10 (S40); forming a vacuum state in an inner space through a vacuum pump connected to the vacuum injection body 30 and injecting the working fluid into the inner space through a supply port 32 formed on an upper side or side surface of the vacuum injection body 30 (S50); when the injection of the working fluid is completed, bending the lower plate 20 at the portion of the inlet 12 through a pressing body 40 such that the step 14 of the inlet 12 is brought into contact with the lower plate 20 to close the inlet 12 (S60); and manufacturing a vacuum chamber 1 by welding the lower plate 20, which closes the inlet 12, to the upper plate 10 by laser welding using a laser welding device 50 to seal the inlet 12 and then separating the vacuum injection body 30 (S70).

The operation of preparing the lower plate 20 (S20) is to prepare the lower plate 20, which is formed in a metal plate shape and includes the plurality of first protrusions 21 formed to protrude and formed on the one side of the upper surface thereof to be spaced apart from each other by a predetermined distance, and the first joint body 23 formed to protrude upward and formed at a predetermined distance inward from the outer edge thereof along the edge shape.

When the lower plate 20 formed as described above is prepared, through the operation of preparing the upper plate 10 (S20), the upper plate 10 is prepared, which is formed in a shape corresponding to the lower plate 20 and includes the second joint body 13 formed to protrude and joined to the upper side of the lower plate 20, a plurality of second protrusions 11 formed to protrude so as to correspond to the first protrusions 21, the inlet 12 formed on the inner side of each of the second protrusions 11 and into which the working fluid is injected, and the step 14 formed to be wider than the inlet in a lower side direction of the inlet and, when the lower plate is bent, brought into contact with the lower plate and welded.

When the upper plate 10 and the lower plate 20 are prepared, the upper plate 10 and the lower plate 20 are joined through a bonding agent.

Here, the bonding agent is made of an adhesive or the like so that the upper plate 10 and the lower plate 20 are bonded and sealed.

When the upper plate 10 and the lower plate 20 are bonded, the upper plate 10 and the lower plate 20 may be bonded with a mesh interposed therebetween.

The mesh allows the flow of the working fluid to be dispersed and allows the working fluid to easily flow into the inner space by being in contact with the mesh.

When the upper plate 10 and the lower plate 20 are bonded, the vacuum injection body 30 is coupled to the inlet 12 of the upper plate 10 through the operation of coupling the vacuum injection body 30 (S40).

When the vacuum injection body 30 is coupled as described above, a vacuum state is formed in the inner space of the vapor chamber through the operation of injecting the working fluid into the inner space (S50), and the working fluid is injected.

The vacuum injection body 30 is coupled such that a lower portion thereof covers the inlet 12 of the upper plate 10 and includes the suction port 31 formed therein to suction air in the inner space of the vapor chamber through a vacuum pump connected to an upper side of the suction port 31 to make a vacuum state in the inner space, and the supply port 32 formed on the upper side or side surface thereof and to which the working fluid injection device is connected to inject the working fluid into the vacuumed inner space.

When the injection of the working fluid is completed, the lower plate 20 at the portion of the inlet 12 is bent through the pressing body 40 to close the inlet 12 through the operation of closing the inlet 12 (S60).

Here, the pressing body 40 is formed to correspond to the step 14 formed in the inlet 12 of the upper plate 10, maintains a pressurized state to maintain the bent state continuously (when bent, the upper and lower plates need to be attached without any gap) during the laser welding, and includes a through-hole 41 formed to pass through an inside pressing body 40 to perform the laser welding in the pressurized state so that the laser welding may be performed in the pressurized state.

When the lower plate 20 is bent, through the operation of manufacturing the vacuum chamber 1 (S70), the lower plate 20, which closes the inlet 12, is welded to the upper plate 10 by laser welding using the laser welding device 50 to seal the inlet 12 and then the vacuum injection body 30 is separated, thereby manufacturing the vacuum chamber 1.

In the present disclosure configured as described above, since a vacuum state is formed in the inner space of the vapor chamber for portable electronic devices and the inlet configured to inject the working fluid is formed on a plane, there are effects in which the inconvenience of installing a cooling device inside the portable electronic device may be eliminated, a vacuum state in the inner space may be formed at a high speed, and a large amount of working fluid may be injected in a short time.

Further, since the inlet is formed on a plane, there is an effect of preventing damages and manufacturing defects of the vapor chamber while forming a vacuum state or injecting the working fluid and sealing the inlet.

The thin film vapor chamber for portable electronic devices without an injection tube is not limited to the configuration and the operation method of the embodiments described above. The embodiments may be configured such that all or a part of each embodiment is selectively combined to perform various modifications.

What is claimed is:

1. A thin film vapor chamber for a portable electronic device without an injection tube, which is provided inside the portable electronic device and configured to radiate heat, the thin film vapor chamber comprising:
    a lower plate (20) formed in a metal plate shape and including a plurality of protrusions (22) formed on an upper surface thereof, a plurality of first protrusions (21) formed to protrude and formed on one side of the upper surface thereof to be spaced apart from each other by a predetermined distance, and a first joint body (23) formed to protrude upward and formed at a predetermined distance inward from an outer edge thereof along an edge shape; and
    an upper plate (10) formed in a shape corresponding to the lower plate (20) and including a second joint body (13) formed to protrude and joined to an upper side of the lower plate (20), a plurality of second protrusions (11) formed to protrude so as to correspond to the first protrusions (21), an inlet (12) formed on an inner side of each of the second protrusions (11) and into which a working fluid is injected, and a step (14) formed to protrude downward so as to close the inlet (12) by being brought into contact with the lower plate (20) when the lower plate (20) is bent to the inlet (12),
    wherein an inner space formed between the upper plate (10) and the lower plate (20), in a state in which the lower plate (20) is closely coupled to the inlet (12) of the upper plate (10) and joined thereto, is made to be in a vacuum state through a vacuum injection body (30), and
    the working fluid is injected into the inner space.

2. The thin film vapor chamber of claim 1, wherein the portable electronic device includes a smartphone, a wireless charger, a laptop computer, a portable device for games, or a tablet personal computer (PC).

3. The thin film vapor chamber of claim 1, wherein the vacuum injection body (30) is formed to be larger than the inlet (12) so as to be in close contact with the inlet (12) of the upper plate (10) and coupled to cover the inlet (12) of the upper plate (10), and includes a suction port (31) formed therein to suction air in the inner space of the vapor chamber through a vacuum pump connected to an upper side of the suction port (31) to make a vacuum state in the inner space and a supply port (32) formed on an upper side or side surface thereof and to which a working fluid injection device is connected to inject the working fluid into the vacuumed inner space.

4. A method of manufacturing a thin film vapor chamber for a portable electronic device without an injection tube, the method comprising:

preparing a lower plate (20) formed in a metal plate shape, which includes forming a plurality of protrusions (22) on an upper surface of the lower plate (20), forming a plurality of first protrusions (21) protruding at a predetermined interval on one side of the upper surface of the lower plate (20), and forming a first joint body (23) protruding upward at a predetermined distance inward from an outer edge of the lower plate (20) along an edge shape (S10);

preparing an upper plate (10) formed in a shape corresponding to the lower plate (20), which includes forming a second joint body (13) protruding and being joined to an upper side of the lower plate (20), forming a plurality of second protrusions (11) protruding so as to correspond to the first protrusions (21), forming an inlet (12), into which a working fluid is injected, on an inner side of each of the second protrusions (11), and forming a step (14) protruding downward so as to close the inlet (12) by being brought into contact with the lower plate (20) when the lower plate (20) is bent to the inlet (12) (S20);

bonding the upper plate (10) and the lower plate (20) through a bonding agent (S30);

coupling a vacuum injection body (30) to the inlet (12) of the bonded upper plate (10) (S40);

forming a vacuum state in an inner space through a vacuum pump connected to the vacuum injection body (30) and injecting the working fluid into the inner space through a supply port (32) formed on an upper side or side surface of the vacuum injection body (30) (S50);

when the injection of the working fluid is completed, bending the lower plate (20) at a portion of the inlet (12) through a pressing body (40) such that the step (14) of the inlet (12) is brought into contact with the lower plate (20) to close the inlet (12) (S60); and manufacturing a vacuum chamber (1) by welding the lower plate (20) which closes the inlet (12) to the upper plate (10) by laser welding using a laser welding device (50) to seal the inlet (12) and then separating the vacuum injection body (30) (S70).

5. The method of claim 4, wherein the vacuum injection body (30) is formed to be larger than the inlet (12) so as to be in close contact with the inlet (12) of the upper plate (10) and coupled to cover the inlet (12) of the upper plate (10), and the vacuum injection body (30) includes a suction port (31) formed therein to suction air in the inner space of the vapor chamber through a vacuum pump connected to an upper side of the suction port (31) to make a vacuum state in the inner space, and a supply port (32) formed on an upper side or side surface thereof and to which a working fluid injection device is connected to inject the working fluid into the vacuumed inner space.

6. The method of claim 4, wherein the pressing body (40) is formed to correspond to the step (14) formed in the inlet (12) of the upper plate (10), maintains a pressurized state to maintain the bent state continuously (when bent, the upper and lower plates need to be attached without any gap) during laser welding, and includes a through-hole (41) formed to pass through an inside of the pressing body (40) to perform the laser welding in the pressurized state so that the laser welding is performed in the pressurized state.

* * * * *